United States Patent [19]

Converse et al.

[11] Patent Number: 4,719,407

[45] Date of Patent: Jan. 12, 1988

[54] AUTOMATED SEARCH APPARATUS FOR LOCATING LEAKS IN GEOMEMBRANE LINERS

[75] Inventors: Merle E. Converse, Helotes; David W. Shultz, San Antonio, both of Tex.

[73] Assignee: Southwest Research Institute, San Antonio, Tex.

[21] Appl. No.: 824,440

[22] Filed: Jan. 31, 1986

[51] Int. Cl.⁴ .................. G01R 31/08; G08B 21/00
[52] U.S. Cl. ........................ 324/546; 340/605
[58] Field of Search ............ 324/52, 54, 323, 36; 340/850–852, 604, 605; 114/144 A

[56] References Cited

U.S. PATENT DOCUMENTS 3,526,831 9/1970 Smith .................... 324/326 X
3,875,497 4/1975 Madsen .................. 324/326
4,078,510 3/1978 Morgan .................. 324/52 X
4,543,525 9/1985 Boryta et al. .......... 324/54

Primary Examiner—Reinhard J. Eisenzopf
Assistant Examiner—Jack B. Harvey
Attorney, Agent, or Firm—Ted D. Lee

[57] ABSTRACT

An automated search apparatus is disclosed for detecting leaks in liquid impoundments usually defined by a geomembrane layer. A voltage gradient is created within the impoundment by means of a source electrode. The search apparatus contains pairs of electrodes coupled to differential amplifiers which allow plotting of the voltage gradient within the impoundment. The search vessel is controlled via radio telemetry, and its position may be tracked using optical theodolites. A distortion in the equipotential lines associated with the voltage gradient indicates the presence of a leak.

13 Claims, 4 Drawing Figures

AUTOMATED SEARCH APPARATUS FOR LOCATING LEAKS IN GEOMEMBRANE LINERS

FIELD OF THE INVENTION

The present invention relates to a method and apparatus for locating leaks in geomembrane liners used to contain liquids in surface impoundment facilities. More specifically, the present invention provides an automated mobile survey apparatus and measurement system which can be used to survey a liquid impoundment to detect one or more leaks in the geomembrane liner. Leak detection is achieved by sensing changes in voltage gradients on the surface or in the volume of the contained liquid and these changes can be systematically correlated with the location of the leak(s).

BACKGROUND

Geomembrane liners (often called flexible membrane liners) are large sheets of plastic or rubber material used as a barrier to contain liquids in an impoundment. Facilities where these liners are commonly used include hazardous waste impoundments, potable water reservoirs and other surface impoundments.

At certain types of facilities, such as hazardous waste surface impoundments, it is extremely important to know whether the liner is intact and is performing its intended containment function. Failure to detect and repair a leak can lead to serious ground water and surface water contamination.

Geomembrane liners are generally inspected for physical integrity during installation. Such inspection usually consists of a visual inspection of the surface of the individual sheets which are attached to form the liner combined with physical testing of the seams between the various sheets.

A commonly used approach for monitoring the performance of liners after they are put into service has typically been based on ground water sampling using one or more monitoring wells placed at appropriately selected locations around the impoundment. However, this ground water sampling method provides only an indirect indication of leakage and is not timely, since the ground water contamination may not be detected in monitoring wells for some time after a leak in the liner has occurred. By the time a leak has been detected by this method, substantial ground water contamination may have already occurred.

Another source of inadequacy in the ground water sampling method stems from the need to have the monitoring well in the particular aquifer which is transporting the contaminants. An adequate ground water monitoring program, therefore, requires a large number of monitoring wells along the perimeter of the impoundment with a sufficient number of wells sampling water from different levels within the various aquifers under the impoundment. Even the most elaborate ground water monitoring system, however, cannot provide monitoring as accurate and timely as the invention system because of the inherent limitations discussed above.

The method for detecting and locating leaks in geomembrane liner systems uses an electrical measurement technique which takes advantage of the high electrical insulating properties of the liner with respect to the liquid contained above the liner and the soil under the liner. In general, geomembrane liners made from an impervious plastic material or rubber have a very high electrical resistance. A liner installed in a liquid impoundment, therefore, effectively acts as an electrical insulator between the materials contained within the liner and the surrounding environment. If the integrity of the liner is lost due to a puncture or separation, however, conductive liquid may then flow through the leak, thus establishing an electrical path through the liner between the contained liquid and the conductive earth in surrounding contact with the underside of the liner. The low resistance path forms an forms an electrically detectable region corresponding to the location of a leak which may be detected and located.

The electrical measurement technique described above is discussed in greater detail in the publication "Electrical Resistivity Technique to Assess the Integrity of Geomembrane Liners," Final Technical Report, Southwest Research Institute, Project No. 14-6289, EPA Contract No. 68-03-3033 (1984), which by this reference is incorporated for all purposes.

SUMMARY OF THE INVENTION

The invention apparatus and method for locating leaks in geomembrane liners operates by, first, injecting an electrical current from a source into an essentially insulating enclosure and returning this current flow through a path defined by the contained liquid, the liner, and the conducting earth in external contact with the liner. The current source is comprised of a DC voltage source having a source electrode in the conducting liquid and a sink electrode in the conducting earth. Current flows from the voltage source through the resistance provided by the combined effective resistivity of the conducting liquid, the liner, the conducting earth and the contact resistance of the source and sink electrodes. A characteristic voltage gradient associated with the current flow is thus established on the surface of the contained liquid, the interior volume of the liquid and the surrounding earth.

In the preferred embodiment, the insulating enclosure comprises a geomembrane liner having a very high electrical resistivity. For a liner with no leaks, the voltage gradients in the conducting liquid will have a characteristic distribution on the liquid surface and only a small amount of current will flow through the liner. If the liner has a leak, however, a low resistance path is established between the contained liquid through the leak to the conducting earth surrounding the liner. A current proportional to the size of the leak is allowed to flow through the liner via the low resistance shunt.

The existence of a leak in the liner and the associated increased flow of current through the liner at the point of the leak causes a distortion in the otherwise relatively uniformly distributed voltage gradient on the surface and in the volume of the contained liquid. This distortion in the potential gradient pattern can be measured by the automatic search apparatus of the present invention and used to determine the exact location of the leak. Potential gradient measurements can be made on the surface of the liquid or at some depth within the volume of the liquid.

The automatic search apparatus of the present invention is a remotely-operated vehicle containing potential measuring electrodes in contact with the impounded liquid. In the survey mode of operation, the vehicle travels across the surface of the liquid contained in the impoundment while taking measurements of the potential gradients along the longitudinal and transverse axes of the vehicle and transmitting these readings via a data telemetry link to a data collection unit located on the shore. These data together with information on the position of the vehicle in the impoundment are processed to determine the location of the leak(s). The gradients sensed by the measuring system are a function of the current distribution in the liquid. A nonuniform distribution can be correlated with electric current flowing through a leak in the geomembrane liner.

Any one of several methods can be used to determine the location of the vehicle in the impoundment so that potential gradient measurements can be matched with corresponding vehicle positional data to enable the spatial locations of the leaks to be established for future reference to facilitate repairs of the liner. One of the most direct methods of vehicle position determination employs two optical theodolites instrumented to provide readouts of the vehicle azimuth angles as measured from two widely spaced locations separated by a known distance and referenced to the geometrical dimensions and position of the geomembrane liner installation. Therefore, each data point of interest will consist of two potential gradient measurement values (longitudinal and transverse with respect to the fore and aft axes of the vehicle) and two theodolite azimuth angles, all of which are recorded and stored by the shore station. These data are telemetered to and recorded by the shore station at periodic time intervals, e.g. once a second, determined by a clock onboard the vehicle or at distance intervals, e.g. one-half meter, of vehicle travel, as determined by a Savonius rotor odometer on the vehicle.

In the automatic search mode of operation, the potential measuring system contained in the automatic search apparatus is comprised of a network of electrodes operable to sense changes in the potential gradient in the liquid along both the longitudinal and the transverse axes of the vehicle. Feedback control circuitry connected to this electrode network provides a control signal to cause the vehicle steering mechanism to direct the vehicle along equipotential lines which are correlatable with a leak in the underlying geomembrane liner. Data transmitted from the vehicle to the collection unit on the shore, when combined with information on the vehicle position in the impoundment as obtained by a method such as one based upon optical theodolite tracking and azimuth angle readout, as explained above, can be processed and correlated with the precise location of a leak in the geomembrane liner.

DETAILED DESCRIPTION OF THE PREFERRED EMBODIMENT

Figure 1A:
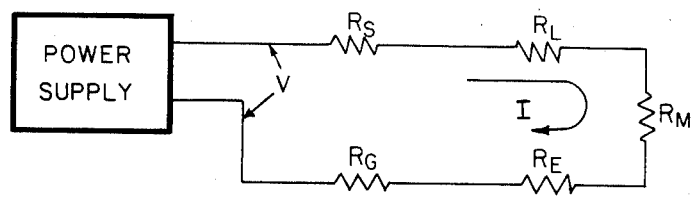
FIG. 1a is a schematic representation of the equivalent resistances of the various components of a geomembrane lined liquid impoundment.
Figure 1:
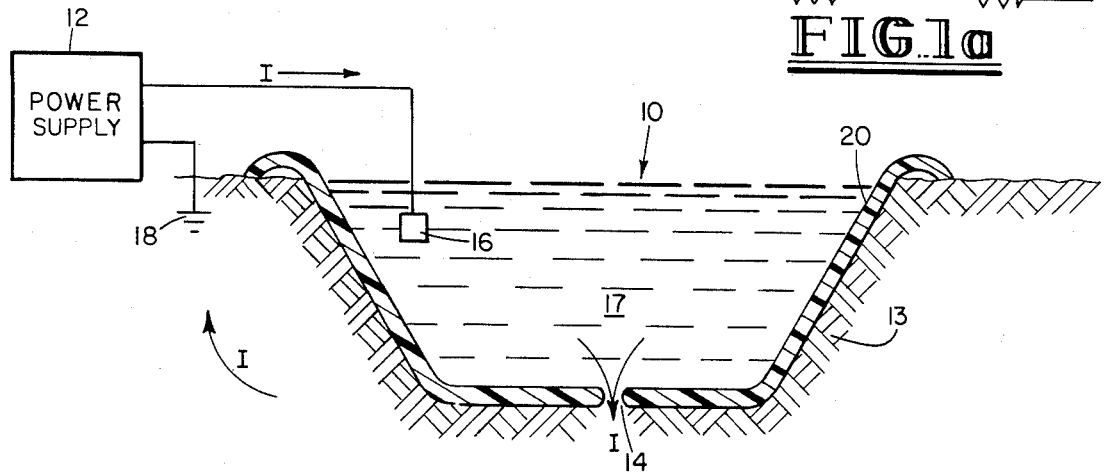
FIG. 1 is a sectional side view of a surface impoundment showing a schematic representation of the current injection apparatus of the present invention.
Figure 2:
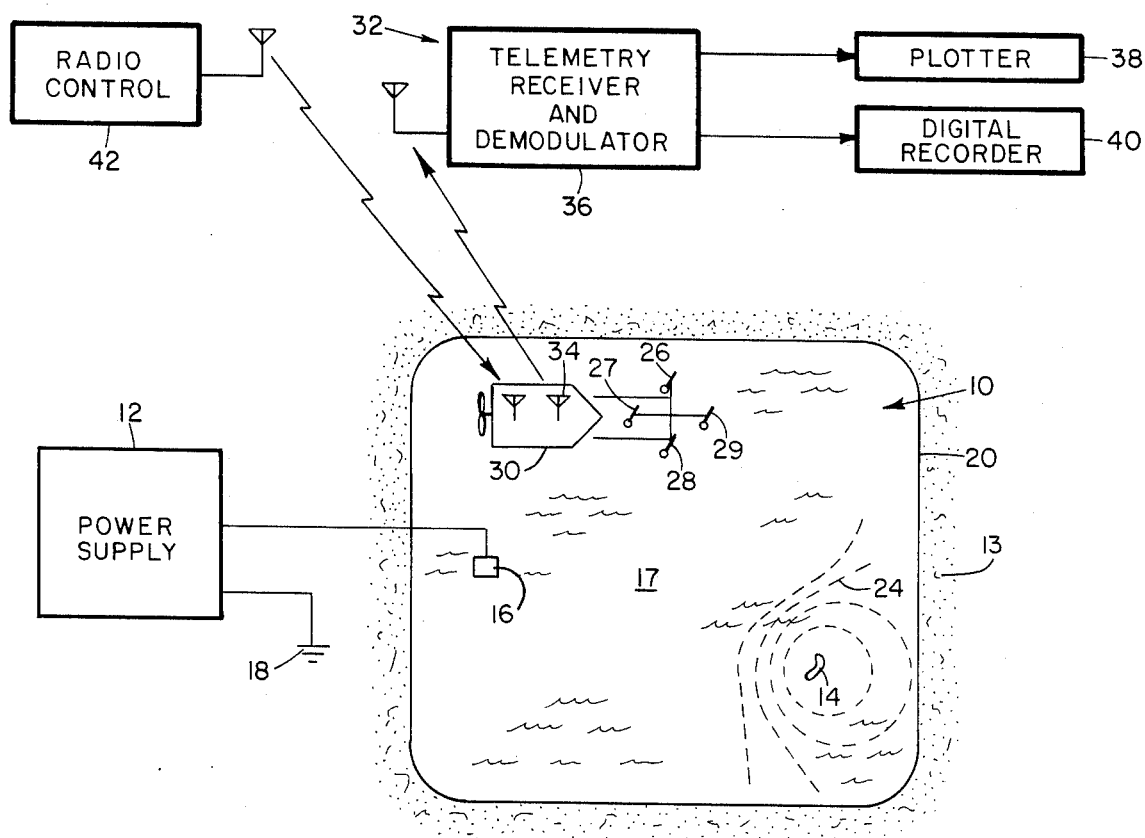
FIG. 2 is a plan view of a hypothetical surface impoundment showing the remotely operated detection vehicle and a schematic representation of the telemetry for controlling the vehicle and for communicating data.

The apparatus for utilizing the electrical measurement technique to detect and locate leaks in a geomembrane liner is shown generally in FIGS. 1 and 2. In the preferred embodiment, a voltage source 12 having a source electrode 16 and a sink electrode 18 is connected to the impoundment 10 with the source electrode 16 immersed in the conducting liquid 17 contained within the surface impoundment 10, while the sink electrode 18 is placed in the conducting earth at some point along the perimeter of the impoundment 10.

The total current I passing through the system is a function of the voltage of the voltage source or power supply 12 and the total resistance provided by the combined effective resistance of the contained liquid 17, the geomembrane liner 20, the conducting earth 13 in surrounding contact with the liner 20, and the contact resistances of the source and sink electrodes, 16 and 18, respectively.

The source electrode 16 of the preferred embodiment is comprised of a suitable current source electrode, such as a 3 foot diameter brass disk having a 1/16 inch thickness. Brass is particularly well suited as a source electrode material for the invention apparatus because it has excellent conductive properties and is resistant to corrosion. Other materials may also be suitable, depending on the corrosive nature of the liquid. The circular shape of the source electrode 16 helps to reduce the voltage gradient anomalies in the immediate vicinity of the electrode.

The sink electrode 18 completes the current path to the voltage source 12. The sink electrode 18 is a suitable grounding electrode, such as a copper-clad steel rod which is driven into the ground to a depth of approximately 36 inches. Increased surface area of the sink electrode 18 can be achieved by connecting three rods of the type described above with a common conductor. The increased surface area of the multiple electrode arrangement reduces the voltage drop between the electrodes and the earth resulting from the electrode contact resistance.

The geomembrane liner 20 is constructed of an impervious plastic or rubber material having a very high electrical resistance. Typical materials used to form the liner include high density polyethylene or polyvinyl chloride. The resistivity of the liner materials used in the preferred embodiment may range from approximately $2 \times 10^{14}$ ohm-cm to $2 \times 10^{16}$ ohm-cm.

The liner 20 of the preferred embodiment is formed from a plurality of elongated sheets of the resistive material, with complementary edges of the sheets attached to form an integral liner 20. The liner 20 constructed as described above is inspected visually during installation to identify punctures in the surfaces of the individual sheet members or faults in the seams between the respective sheets.

An unfaulted liner 20 has a very high electrical resistance for the reasons discussed above and, therefore, only a very small magnitude of current will pass therethrough. With the voltage source 12 connected to the impoundment having an unfaulted liner 20, the voltage produced by the voltage source 12 is divided approximately according to the resistance of the liquid, $R_L$, the resistance of the geomembrane liner, $R_M$, the resistance of the earth, $R_E$, and the contact resistances of the source electrode 16 and sink electrode 18, $R_S$ and $R_G$, respectively. FIG. 1a is a schematic representation of the equivalent circuit formed by the combination of the above-mentioned resistances. The current flow produced by the voltage source 12 can be calculated from the relationship:

$$I = \frac{V}{R_L + R_M + R_E + R_S + R_G} \quad (1)$$

The liquid 17 contained in the impoundment forms a large distributed resistance in which the geometric distribution of current flow is dependent upon the size, shape, and depth of the body of the liquid 17 and the position of the source electrode 16 in the liquid body. This distribution of current can be characterized in large measure by the magnitude of current passing through each unit area of a closed surface surrounding the source electrode 16. Such a characterization of current is termed the current density. The total current, I, is the surface integral of the current density computed over any closed surface surrounding the source electrode 16. Thus, in the case of the geomembrane liner 20 described above, since all of the source current must flow through the liquid-liner surface interface, the total current can be specifically represented by the integral of the current density over the liner surface defined by the liquid level line boundary. Intermediate surfaces within the liquid volume and located between the source electrode 16 and the liquid-liner interface can also be used in such surface integrations to compute the total source current.

By connecting points of equal current density on each successive intermediate surface between the current source electrode 16 and the liner, flow lines of constant current density can be established, thereby mapping the distribution of electric current within the volume of liquid 17 contained by the impoundment. By physical principle, each such current flow line will follow a path of least resistance from the source electrode 16 through the liquid and through the liner 20 to the surrounding earth 13. If the liquid 17 and the liner 20 have uniform resistivities, then the spatial distribution of the current within the liquid 17 will be dependent only upon the size and shape of the liquid-liner interface and the position of the source electrode 16 within the geometry defined by that interface. In the case of an unfaulted geomembrane liner, the resistance contrast between the high resistivity liner and the more conductive liquid 17 will be such that the current density through the liquid-liner surface and through the various intermediate surfaces located well away from the source electrode 16 will be relatively uniform.

The finite resistivity of the liquid 17 contained within the liner 20 causes a voltage drop between the surface of the source electrode 16 and the liner 20 when the source power supply 12 is energized. This voltage drop, $V_L$, is expressed by:

$$V_L = IR_L = \left( \frac{R_L}{R_L + R_M + R_E + R_S + R_G} \right) V. \quad (2)$$

Because the resistance of the liquid body 17, $R_L$, is a distributed resistance, there are also voltage differences within the body of the liquid 17. In particular, along each line of constant current density there are incremental voltage drops whose sums can be considered to be approximately equal to the total voltage drop, $V_L$, in the liquid 17. By connecting points of equal potential along each line of constant density, specific surfaces, termed equipotential surfaces, are identified and the vector directions normal to such equipotential surfaces (parallel to the current density flow direction at each point on the surface) define the direction of the potential gradient within the body of the liquid. Such equipotential surfaces and potential gradients are important to this invention since, by their measurement and interpretation, anomalous conditions of current density distribution within the impounded liquid 17 can be measured and interpreted to reveal the presence and location of the leak 14 in the liner 20.

When the current density within the contained liquid 17 is relatively uniform, as in the case of an unfaulted liner 20, the voltage gradients in the body of the liquid 17 are small. When a leak 14 is present in the liner 20, the current flow through the liner 20 tends to concentrate along the lower resistance path through the leak 14, thereby causing higher voltage gradients in the vicinity of the leak 14. These anomalous changes in the potential gradients also change the spatial location and shapes of the equipotential surfaces mentioned above.

As was discussed above, the equipotential lines associated with an unfaulted liner 20 will be distorted in the vicinity of a leak of liquid through a perforation 14 in the liner. Such distortion is illustrated in FIG. 2 by the distorted equipotential lines 24. This distortion of the equipotential lines 24 can be used to detect the location of a leak by moving a differential voltage measurement probe along the surface of the liquid 17 contained in the impoundment.

FIG. 2 is a plan diagram of the automated leak detection apparatus showing the basic functions of operation. A floating remotely-operated vehicle 30 containing the potential measuring system is placed on the surface of the liquid 17 in the impoundment. A DC voltage, for example, is applied to the impoundment using a DC source 12, as described above. Because the geomembrane liner 20 is an electrical insulator, the flow of DC current will be concentrated through any low-resistance paths such as those associated with leaking perforations 14. The impounded liquid 17 must have a conductivity which is higher than that of the geomembrane material and the liquid must have migrated through the perforation 14 to make electrical contact with the underlying earth.

The remotely-operated vehicle 30 contains the electronics package for measuring potentials on the surface of the liquid 17 and transmitting these readings to a data collection unit 32 located on the shore. The potentials are a function of the distribution of electric current in the liquid 17. Potential gradients characteristic of a leak in the liner 20 result from the nonuniform distribution of electric current in the vicinity of a leak.

Potential signals in analog form are converted to digital form, then these data are transmitted to the shore using a radio telemetry link 34. On the shore, the telemetry signal is received and processed by the telemetry receiver and demodulator 36 to recover information pertaining to voltage potentials in the impoundment. The recovered data can be displayed on a plotter 38 or stored in digital form in the digital recorder 40.

Figure 3:
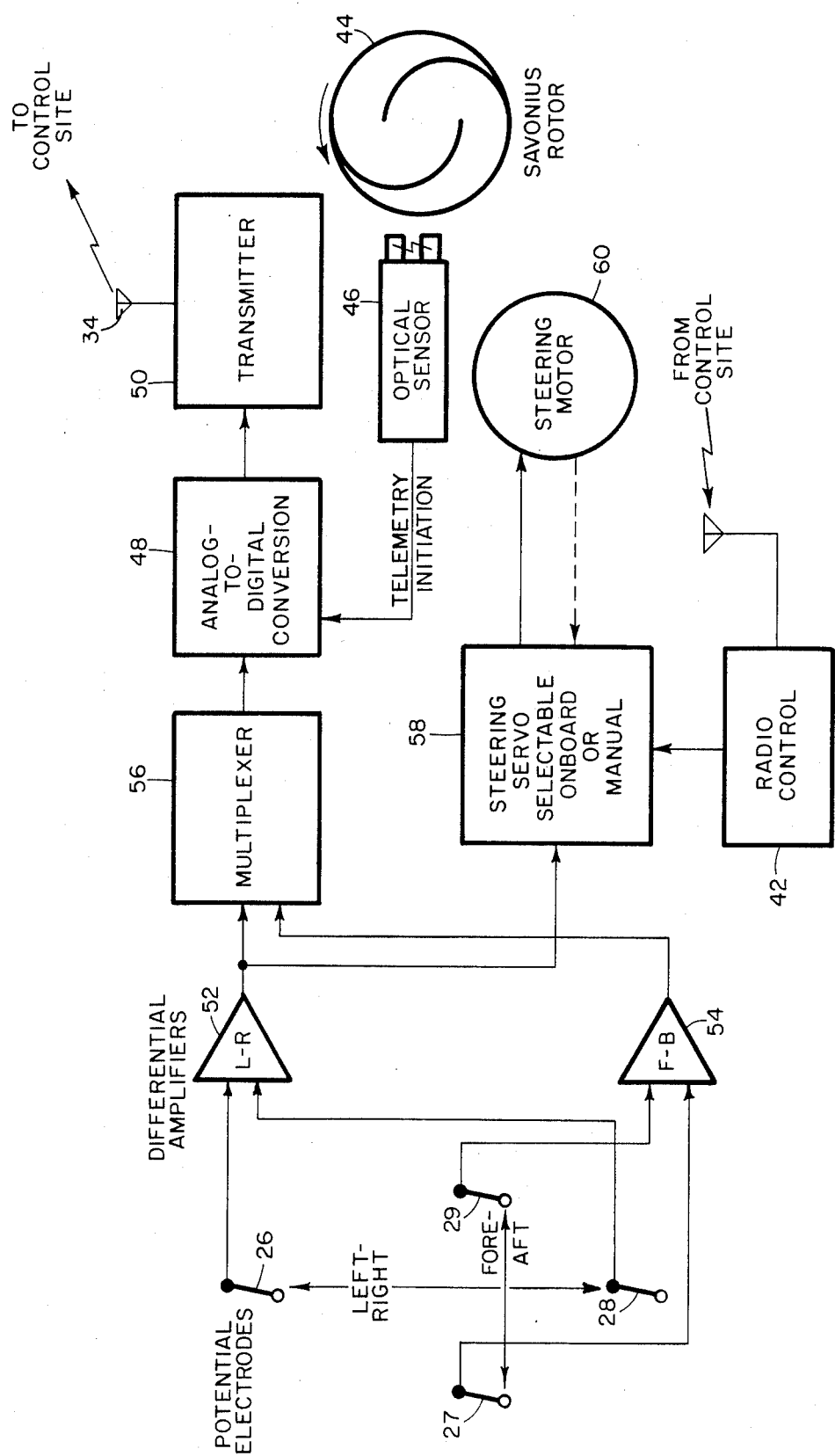
FIG. 3 is a block diagram representation of the system components of the invention automatic leak detection system.

FIG. 3 shows a block diagram of the potential gradient measuring system, radio telemetry system and Savonius rotor liquid odometer. The transmission of data from the remotely-operated vehicle 30 is initiated by pulse signals generated by the Savonius rotor 44 which serves as a distance measuring odometer immersed in the liquid and coupled to an optical shaft rotation sensor 46. The Savonius rotor together with the optical sensor 46 produces a pulse output signal for each 0.5 meter of travel by the vehicle 30. This pulse activates the analog-to-digital converter 48 to cause the analog potential signals to be digitized and transmitted by the transmitter 50 to the data collection and control unit 32 on the shore. The plotter position is continuously updated to display each new data transmission from the vehicle 30. Radio control of the speed and steering of this vehicle is accomplished with the use of commercially available transmitter and receiver units.

The voltage gradient sensor unit on the vehicle 30 is in the form of an orthogonal pair of differential voltage measurement electrodes comprised of left and right electrodes 26 and 28, respectively, and front and rear electrodes 29 and 27, respectively. These electrodes may be arranged to make contact with the surface of the liquid or may be designed to extend below the surface to a prescribed depth. Potential signals from the measurement electrode pairs are converted from differential signals to single-ended signals by the left/right and front/back differential amplifiers 52 and 54, respectively. These signals are then time-division multiplexed by the multiplexer 56 and sent to the analog-to-digital conversion module 48 and then transmitted in digital form by the telemetry transmitter 50.

In the survey mode of operation, the remotely-operated vehicle 30 is steered by an operator using the radio control system so as to survey a specified survey pattern over the liquid surface. Measurements of the two potential difference signals from the orthogonal electrode arrays are transmitted to shore at 0.5-meter intervals of travel for data storage or on-site processing and display. A plot of equipotential contour lines or gradient patterns on a plan map of the liquid impoundment will show the presence and location of leaking perforations in the geomembrane liner 20.

The position of the vehicle in the impoundment associated with each pair of potential difference measurements received from the vehicle via the telemetry system may be determined by optical theodolite tracking and azimuth angle readout from two widely spaced locations referenced to the liner installation. The potential difference measurements and the associated azimuth angles are recorded at the shore station and, together, are processed and displayed to produce the plan map depicting the position of leaks in the geomembrane liner.

As a further method of operation in the remote control mode of guidance, the remotely-operated vehicle 30 can be operated to perform a systematic and complete survey of a liquid impoundment 10 without the need for optical tracking and vehicle position finding by theodolite and triangulation.

To operate the vehicle in this mode of operation, a plurality of parallel guidelines are suspended tautly above the liquid surface and across the impoundment 10 for the purpose of providing visual position reference indications to be used by the operator in steering the remotely-operated vehicle 30. These lines should be two meters apart, and the first line should be one meter from the edge of the liquid surface on the geomembrane 20. The power supply 12 is installed and connected to the source electrode 16 and the sink electrode 18 as shown in FIG. 1. The source electrode 16 must be located outside of the demarked area to be surveyed. The remotely-operated vehicle 30 is then placed in the impoundment 10 and is positioned on the liquid surface.

By means of control commands transmitted from the shore station to the vehicle 30 by the operator, the remotely-operated vehicle 30 is guided to the survey starting point at the edge of the liquid and under the first suspended guide line. The chart recording pe of plotter 38 is then positioned at a reference point corresponding to the start of a traverse across the impoundment 10. As the remotely-operated vehicle 30 traverses across the impoundment 10, the odometer signals telemetered from the vehicle 30 are decoded and the pen of the plotter 38 will be advanced one scaled distance interval corresponding to the travel distance of the vehicle 30 for each output pulse originated by the Savonius rotor 44. These plotting steps correspond to the distance traversed by the remotely-operated vehicle 30. The potential measurements telemetered from the vehicle 30 are decoded by the telemetry receiver and demodulator 32 and will produce a deflection of the marker pen of plotter 38 in a direction perpendicular to the direction of the vehicle travel plotting steps. These deflections will indicate the direction of a detected leak with respect to the vehicle traverse.

Upon the completion of the first scan, the remotely-operated vehicle 30 is steered to the second guide line position and the operator-controlled steering and guidance procedure is then repeated for the return traverse and the telemetered signals received, decoded, and plotted at the shore station. The decoded telemetry data are also recorded on the digital recorder 40.

In the automatic scan mode of operation, the remotely-operated vehicle 30 can be used to automatically search for a leak by switching the vehicle steering mechanism to servo-controlled self-steering operation. In the self-steering mode the steering servo control 58 operates to control the position of the steering motor 60 in response to the output of the left/right differential amplifier 52, as described below. In the self-steering mode of vehicle guidance, the potential difference between the left and right electrodes 26 and 28, respectively, is used to control the position of the steering motor 60. The direction of the steering thrust vector produced by the steering motor 60 then causes the vehicle to traverse in the desired direction.

As shown in FIG. 3, the potential difference between the left and right electrodes is converted to an equivalent steering signal voltage with respect to circuit common by the L-R differential amplifier 52. For this example, the positive lead of the DC power source 12 is connected to the source electrode 16, and the negative lead is connected to the sink electrode 18. Under this condition, the steering signal voltage will be negative with respect to common if the left electrode 26 is closer to a leak. Correspondingly, the steering signal voltage will be positive with respect to common if the right electrode 28 is closer to the leak. When the steering signal voltag is negative indicating that the left electrode 26 is closer to the leak, the steering motor 60 will steer the vehicle to the left. In a similar manner, the vehicle 30 is steered to the right if the steering signal voltage produced is positive indicating that the right electrode 28 is closer to the leak. This results in the direction of traverse being changed to pass through the leak location.

The magnitude of the left thrust produced by the steering motor 60 is proportional to the magnitude of the steering signal voltage produced by the L-R differential amplifier 52. For this purpose, a steering direction feedback circuit is included in the steering servo motor control 58. This feedback circuit prevents overcorrection of the vehicle steering with resulting instability of the vehicle directional control.

The overall effect of the automatic scan mode of operation is to direct the vehicle on a path which is perpendicular to the equipotential lines shown in FIG. 2. When the vehicle arrives at the leak location, the vehicle will circle the leak with the left electrode 26 over the leak. This is because the left electrode 26 is closer to the leak for this condition, and the resulting steering signal voltage will cause the steering motor 60 to turn the vehicle to the left. To move the vehicle away from this leak, the operator can either switch the steering to remote control via the radio control link, or turn off the power source 12.

Finally, as leaks are located by any of the above-mentioned search methods, the vehicle is designed and equipped to automatically drop an appropriate lead weight into the liquid to mark the leak location. Remote control of this function can be achieved by control circuitry which is well known in the art. A marker float attached to the weight by a line will float on the surface of the liquid to provide a visual reference corresponding to the location of a leak in the underlying geomembrane liner. In addition to this method of directly marking the location of leaks, the location of the vehicle can be determined by optical theodolite tracking and azimuth angle readout from two widely spaced locations referenced to the liner installation.

Although the invention method has been described in connection with the preferred embodiment, it is not intended to limit the invention to the particular form set forth, but on the contrary, it is intended to cover such alternatives, modifications, and equivalents as may be included within the spirit and scope of the invention as defined by the appended claims.

We claim:

1. An automated search apparatus for locating a leak in a geomembrane liner having a high electrical resistivity, said liner having one face in contact with a conductive liquid contained by said liner and having the opposite face in contact with a conducting material, comprising:

means for producing a voltage drop between said contained liquid and said conducting material, thereby creating a voltage gradient on the surface and in the interior volume of said liquid, said voltage gradient having a distribution correlatable with a leak in said geomembrane liner;

a propelled, steerable vehicle;

voltage gradient sensing means carried on said vehicle, said sensing means operable to detect a voltage gradient on the surface of said liquid, said voltage gradient sensing means comprising first and second electrode pairs, said first electrode pair being aligned along a longitudinal axis of said vehicle, said second electrode pair being aligned along an axis transverse to said longitudinal axis, said first and said second electrode pairs each being connected to first and second differential amplifiers, respectively, whereby first and second output signals are generated which correlate to the voltage potential difference between said first and said second electrode pairs, respectively;

means for monitoring the position of said vehicle with respect to a reference point and for generating a position reference signal correlatable with the location of said vehicle with respect to said reference point; and signal processing means responsive to said output signals and said position reference signal and operable to correlate said output signal and said position reference signal with the location of a leak in said liner.

2. An automated search apparatus according to claim 1, said means for producing a voltage drop comprising a power source connected in series with a source electrode and a sink electrode, said source electrode being immersed in said liquid, said sink electrode being in contact with said conducting material.

3. An automated search apparatus according to claim 1 further comprising remote control means operable to allow an operator to steer said vehicle from a remote location.

4. An automated search apparatus according to claim 1, said monitoring means further comprising a radio telemetry link for transmitting said output signals to said signal processing means.

5. An automated search apparatus for locating a leak in a geomembrane liner having a high electrical resistivity, said liner having one face in contact with a conductive liquid contained by said liner and having the opposite face in contact with a conducting material, comprising:

means for producing a voltage drop between said contained liquid and said conducting material, thereby creating a voltage gradient on the surface and in the interior volume of said liquid, said voltage gradient having a distribution correlatable with a leak in said geomembrane liner;

a propelled, steerable vehicle;

voltage gradient sensing means carried on said vehicle, said sensing means comprising at least one pair of first and second electrodes, said pair of electrodes being connected to a differential amplifier operable to produce an output signal correlatable with a voltage potential difference between said first and second electrodes;

control means for steering said vehicle;

means for monitoring the position of said vehicle with respect to a reference point and for generating a position reference signal correlatable with the location of said vehicle with respect to said reference point; and signal processing means responsive to said output signals and said position reference signal and operable to correlate said output signal and said position reference signal with the location of a leak in said liner.

6. An automated search apparatus according to claim 5, said control means comprising servo motor control circuitry carried onboard said vehicle.

7. An automated search apparatus according to claim 6, said control means further comprising radio control means for controlling said servo motor control circuitry from a remote location.

8. An automated search apparatus according to claim 5, said monitoring means comprising at least two optical theodolites separated by a known distance.

9. An automated search apparatus according to claim 8, said monitoring means further comprising a radio telemetry link for transmitting said output signal to said signal processing means.

10. An automated search apparatus according to claim 5, said voltage gradient sensing means comprising first and second electrode pairs, said first electrode pair being aligned along a longitudinal axis of said vehicle, said second electrode pair being aligned along an axis transverse to said longitudinal axis.

11. An automated search apparatus according to claim 10, said first and second electrode pairs being in contact with the surface of said liquid.

12. An automated search apparatus according to claim 10, said first and second electrode pairs being immersed in the interior volume of said liquid.

13. A method of surveying a liquid impoundment to detect the location of a leak in a geomembrane liner containing a conducting liquid within said impoundment, said geomembrane liner having one face in contact with said conducting liquid and having another face in contact with a conduct material, comprising the steps of:

creating a voltage drop between said conducting liquid and said conducting material, thereby creating a voltage gradient in said liquid, said voltage gradient having a distribution correlatable with the location of a leak in said liner;

placing a propelled steerable vehicle in said liquid, said vehicle having a voltage sensing means carried thereon, said sensing means operable to detect a voltage gradient on the surface of said liquid and to generate an output signal in response thereto;

said voltge sensing means having a plurality of pairs of first and second electrodes, each of said pairs being connected to a plurality of differential amplifiers, whereby a plurality of output signals are produced by each of said differential amplifiers, said output signals being correlatable with a voltage potential difference of said first and second electrodes of each of said electrode pairs;

moving said vehicle to a plurality of points in said liquid;

monitoring the position of said vehicle with respect to a reference point generating a position reference signal correlatable with the location of said vehicle at each of said points in said liquid with respect to said reference point;

generating a position reference signal correlatable with the location of said vehicle at each of said points in said liquid with respect to said reference point;

transmitting said output signals for each of said points to a monitoring means located on the shore of said impoundment;

processing said output signals and said position reference signal corresponding to each said point to obtain a representation of the voltage gradient distribution in said liquid; and correlating said gradient distribution with the location of a leak in said liner.

* * * * *